(12) United States Patent
Kitahara

(10) Patent No.: US 12,494,767 B2
(45) Date of Patent: Dec. 9, 2025

(54) VIBRATION DEVICE AND METHOD FOR MANUFACTURING VIBRATION DEVICE

(71) Applicant: Seiko Epson Corporation, Tokyo (JP)

(72) Inventor: Koji Kitahara, Ina (JP)

(73) Assignee: SEIKO EPSON CORPORATION (JP)

( * ) Notice: Subject to any disclaimer, the term of this patent is extended or adjusted under 35 U.S.C. 154(b) by 952 days.

(21) Appl. No.: 17/685,434

(22) Filed: Mar. 3, 2022

(65) Prior Publication Data

US 2022/0286107 A1    Sep. 8, 2022

(30) Foreign Application Priority Data

Mar. 4, 2021    (JP) ................................ 2021-034183

(51) Int. Cl.
| | |
|---|---|
| H03H 9/10 | (2006.01) |
| H03H 3/02 | (2006.01) |
| H03H 9/02 | (2006.01) |
| H03H 9/19 | (2006.01) |

(52) U.S. Cl.
CPC ............ *H03H 9/1021* (2013.01); *H03H 3/02* (2013.01); *H03H 9/02102* (2013.01); *H03H 9/02133* (2013.01); *H03H 9/19* (2013.01); H03H 2003/022 (2013.01)

(58) Field of Classification Search
CPC .......... H03H 9/17; H03H 9/19; H03H 9/1014; H03H 9/1021; H03H 9/02102; H03H 9/02133

See application file for complete search history.

(56) References Cited

U.S. PATENT DOCUMENTS 6,812,622 B2 * 11/2004 Matsuyama ......... H03H 9/1021
                                                    310/354
7,358,652 B2 *  4/2008 Aratake ............... H03H 9/0542
                                                    310/340

FOREIGN PATENT DOCUMENTS

| JP | S59-155733 A | 9/1984 |
|---|---|---|
| JP | 2007-114205 A | 5/2007 |
| JP | 2010-223643 A | 10/2010 |
| JP | 2013-250080 A | 12/2013 |
| JP | 2015-059831 A | 3/2015 |

* cited by examiner

*Primary Examiner* — J. San Martin
(74) *Attorney, Agent, or Firm* — Harness, Dickey & Pierce, P.L.C.

(57) ABSTRACT

A vibration device includes a base having a first surface and a second surface that is in a front-back relationship with the first surface, a vibrator disposed at the first surface, and a lid having a first recess that opens toward the first surface, a third surface that is the bottom surface of the first recess, and a fourth surface that is in a front-back relationship with the third surface, the lid being so bonded to the first surface that the vibrator is encapsulated in the first recess, and the lid has a second recess that is part of the third surface recessed toward the fourth surface and includes a diaphragm formed of the bottom surface of second recess and the fourth surface.

7 Claims, 8 Drawing Sheets

VIBRATION DEVICE AND METHOD FOR MANUFACTURING VIBRATION DEVICE

The present application is based on, and claims priority from JP Application Serial Number 2021-034183, filed Mar. 4, 2021, the disclosure of which is hereby incorporated by reference herein in its entirety.

BACKGROUND

1. Technical Field

The present disclosure relates to a vibration device and a method for manufacturing the vibration device.

2. Related Art

For example, JP-A-2010-223643 discloses a method for inspecting the airtightness of a portion that encapsulates a piezoelectric vibrator based on the oscillation frequency before the piezoelectric vibrator is pressurized and the oscillation frequency after the piezoelectric vibrator is pressurized.

The method described in JP-A-2010-223643, however, requires measurement of the oscillation frequency before and after the pressurization, resulting in an increase in man-hours necessary for the inspection and hence an increase in manufacturing cost of the piezoelectric vibrator.

SUMMARY

A vibration device includes a base having a first surface and a second surface that is in a front-back relationship with the first surface, a vibrator disposed at the first surface, and a lid having a first recess that opens toward the first surface, a third surface that is a bottom surface of the first recess, and a fourth surface that is in a front-back relationship with the third surface, the lid being so bonded to the first surface that the vibrator is encapsulated in the first recess, and the lid has a second recess that is part of the third surface recessed toward the fourth surface and includes a diaphragm formed of a bottom surface of second recess and the fourth surface.

A method for manufacturing a vibration device includes preparing a base, mounting a vibrator on the base, preparing a lid, forming a first recess in the lid, forming a second recess further recessed from the first recess, bonding the lid to the base in such a way that the vibrator is accommodated in the first recess and encapsulated by the lid and the base, and processing a surface, of the lid, opposite from the second recess to produce a thin-plate structure.

DESCRIPTION OF EXEMPLARY EMBODIMENTS

In the following drawings, the description will be made using three axes called axes X, Y, and Z perpendicular to one another. The direction along the axis X is called a "direction X", the direction along the axis Y is called a "direction Y", and the direction along the axis Z is called a "direction Z", with the direction indicated by an arrow is the positive direction and the direction opposite the positive direction is the negative direction. The direction +Z is also called "upper" or "upward", and the direction −Z is also called "lower" or "downward" in some cases, and a view in the direction +Z is also called a plan view or planar. The description will be made on the assumption that a surface facing the positive side of the direction Z is called an upper surface, and that a surface facing the negative side of the direction Z, which is a surface opposite from the upper surface, is called a lower surface.

Furthermore, in the following description, consider, for example, a substrate, and the phrase "on the substrate" represents any of the following cases: a case where something is disposed on the substrate so as to be in contact therewith; a case where something is disposed above the substrate via another structure; and a case where something is disposed at the substrate so as to be partially in contact therewith and partially separate therefrom via another structure.

The configuration of a vibration device 100 according to a first embodiment will first be described with reference to FIGS. 1 to 3.

Figure 1:
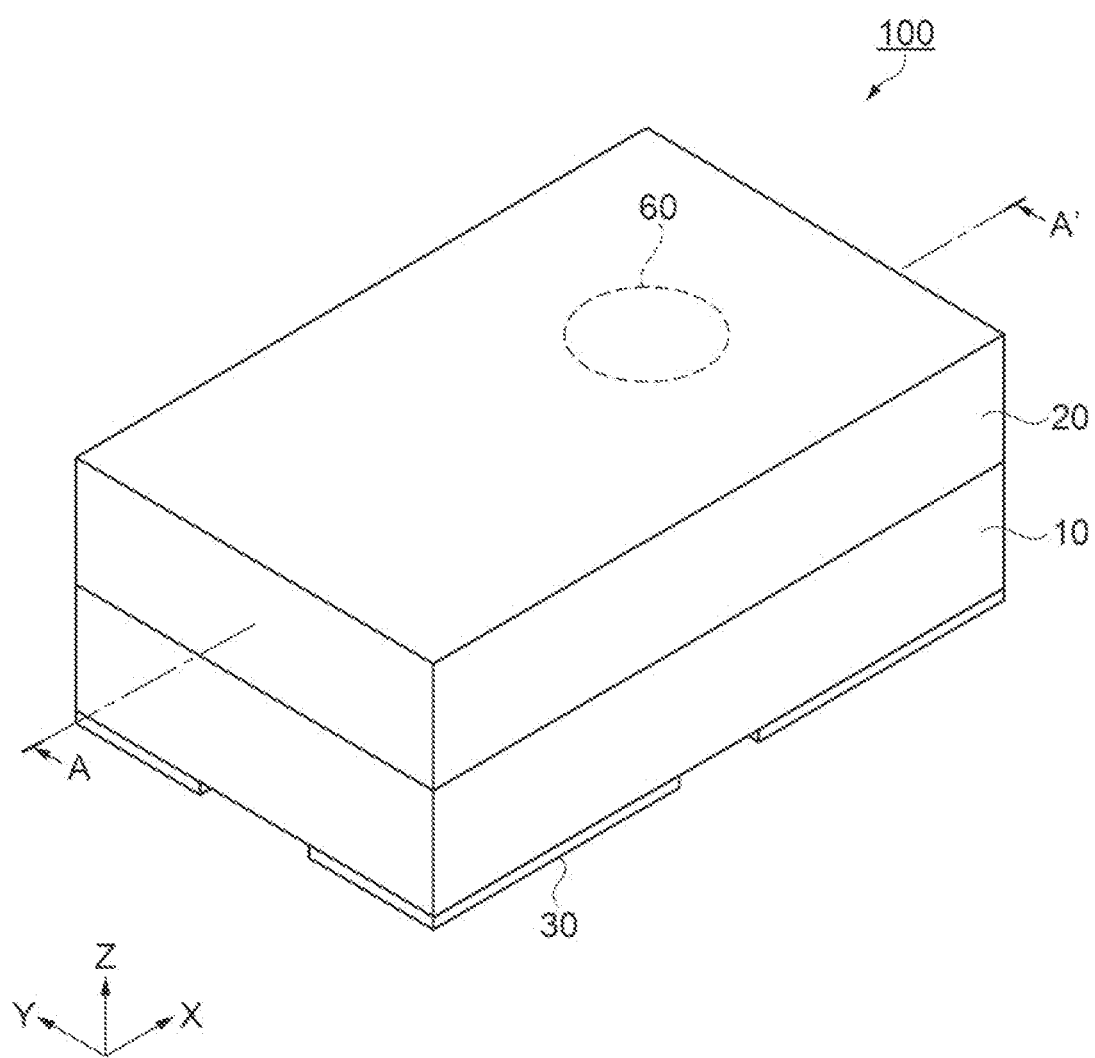
FIG. 1 is a schematic perspective view showing the configuration of a vibration device according to a first embodiment.

The vibration device 100 includes a base 10 and a lid 20 disposed on the base 10, as shown in FIG. 1. A semiconductor substrate 40 (see FIG. 2), which will be described later, is disposed at the upper surface of the base 10. The lower surface of the base 10 is provided with external terminals 30, which provide electrical coupling to an external component. A vibrator 50 (see FIG. 2) is disposed above the base 10.

Figure 2:
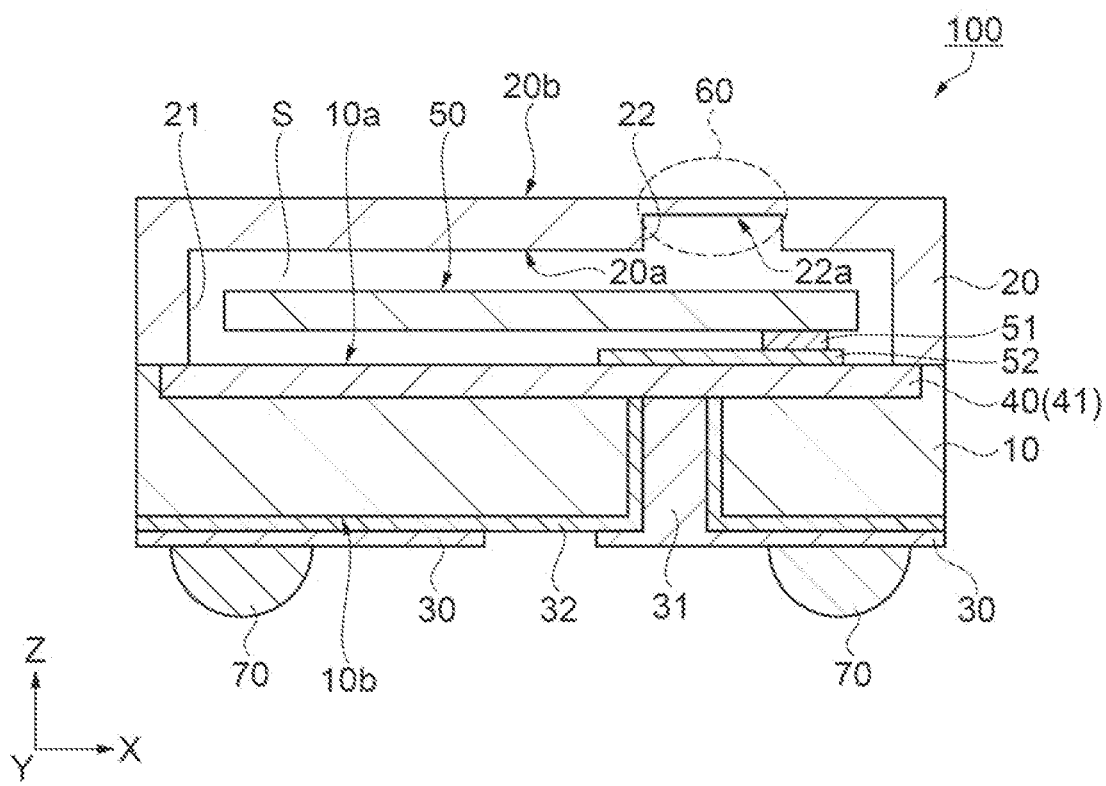
FIG. 2 is a cross-sectional view of the vibration device shown in FIG. 1 taken along the line A-A'.

The base 10 has a first surface 10a, which faces the lid 20, and a second surface 10b, which is a rear surface with respect to a front surface that is the first surface 10a, and where the external terminals 30 are disposed, as shown in FIG. 2. The base 10 is formed, for example, of a single-crystal silicon substrate.

The lid 20 has a first recess 21, which opens toward the first surface 10a of the base 10, a third surface 20a, which is the bottom surface of the first recess 21, and a fourth surface 20b, which is a rear surface with respect to a front surface that is the third surface 20a. Furthermore, the lid 20 is provided with a second recess 22, which is part of the third surface 20a recessed toward the fourth surface 20b.

A bottom surface 22a of the second recess 22 and the fourth surface 20b forms a diaphragm 60. The diaphragm 60 has, for example, a circular shape in the plan view (viewed in direction perpendicular to first surface 10a), as shown in FIG. 1. Since the diaphragm 60 has a circular shape, the diaphragm 60 is allowed to concentrically bend due to a change in the internal pressure in the vibration device 100, whereby a change in the shape of the diaphragm 60 can be readily checked.

The lid 20 is formed, for example, of a single-crystal silicon substrate. Since the base 10 and the lid 20 are each formed of a substrate made of the same single-crystal silicon, thermal stress due to a change in temperature is unlikely to be induced, whereby the deformation of the diaphragm 60 due to a change in temperature can be suppressed. Deformation of the diaphragm 60 due to a change in the internal pressure in a space S as a sealed section can therefore be accurately checked.

The vibrator 50 is mounted in the form of a cantilever at the first surface 10a of the base 10. The vibrator 50 includes, although not illustrated, a vibration substrate, an excitation electrode disposed at the upper surface of the vibration substrate, and an excitation electrode disposed at the lower surface of the vibration substrate. The vibrator 50 is electrically coupled to an integrated circuit 41 in the semiconductor substrate 40 via an electrically conductive bonding member 51, which is coupled to the excitation electrodes, and a mount electrode 52.

The vibrator 50 is encapsulated in a vacuum by the base 10 and the lid 20 when the base 10 and the lid 20 are bonded to each other. The sealed vacuum space S is thus formed in the vibration device 100.

Figure 3:
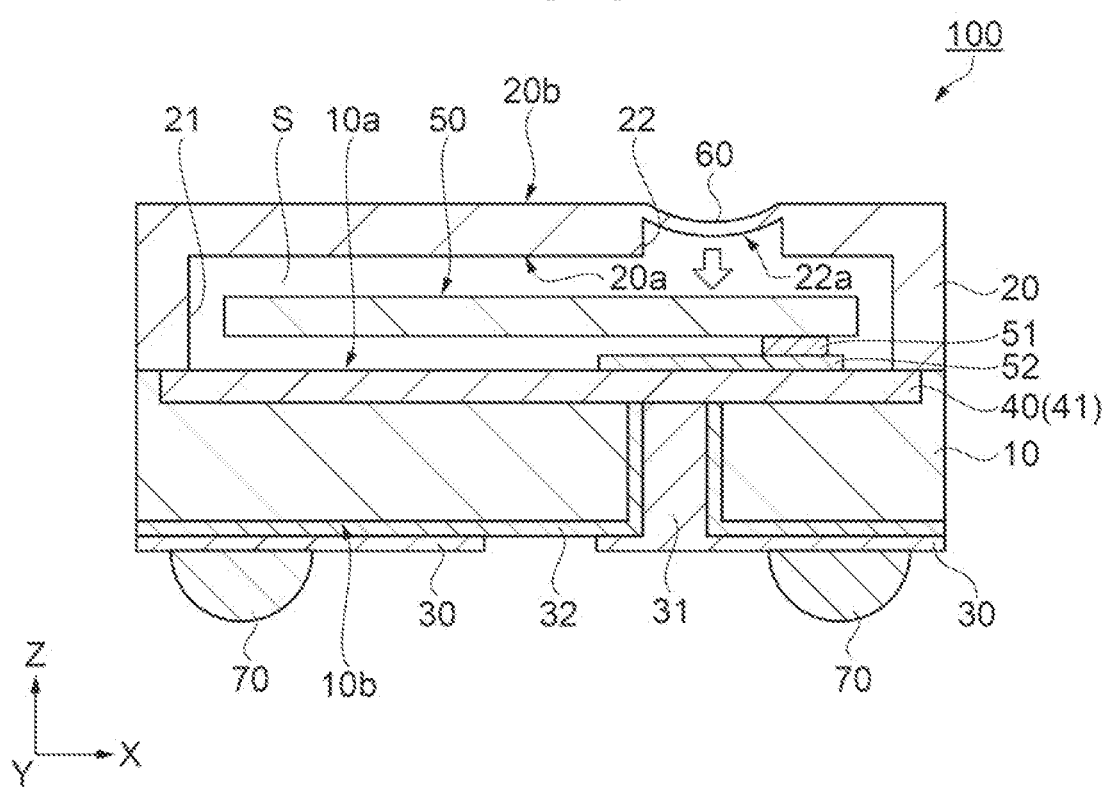
FIG. 3 is a cross-sectional view showing the state of deformation of a diaphragm of the vibration device.
Figure 4:
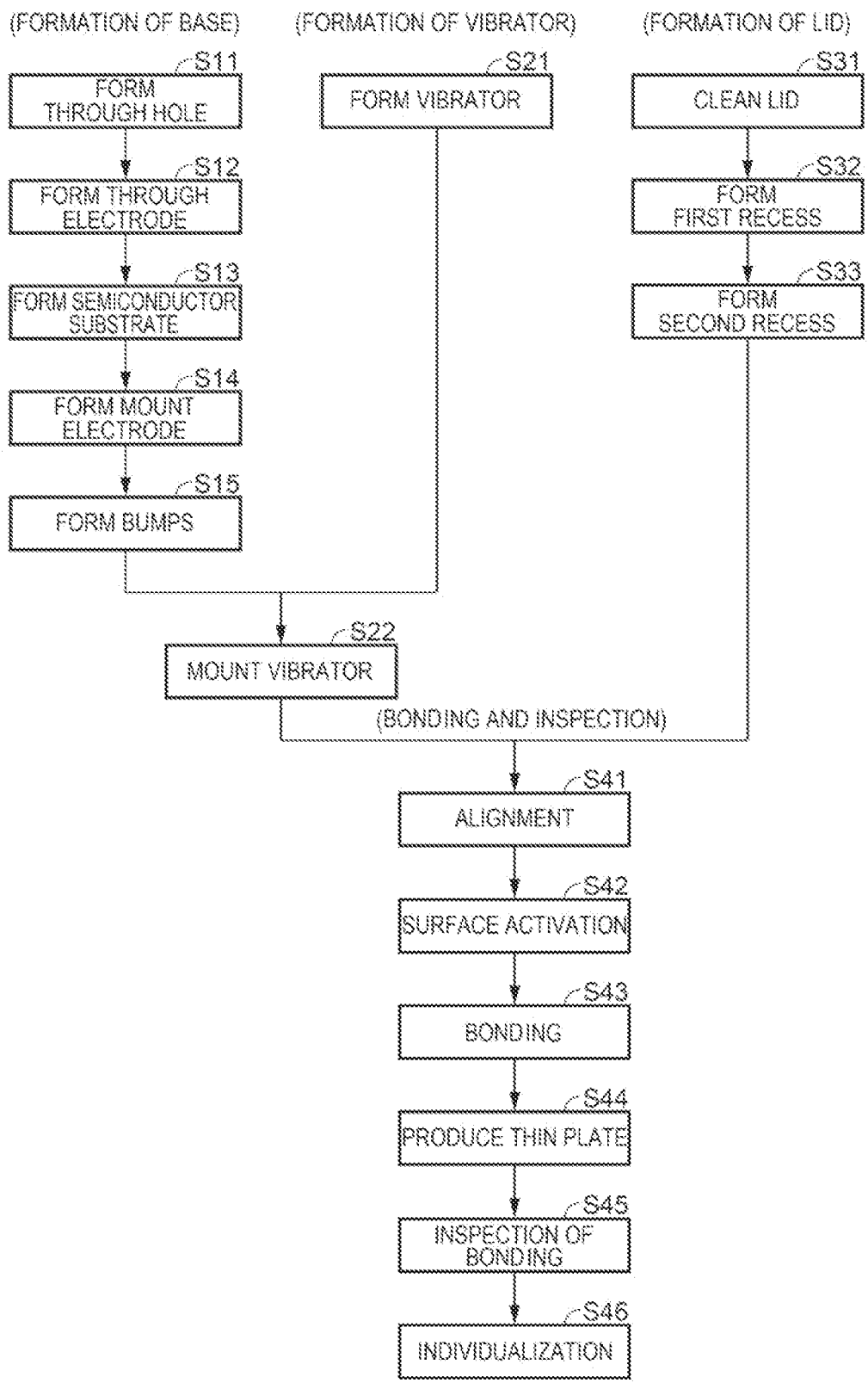
FIG. 4 is a flowchart showing a method for manufacturing the vibration device with the steps of the method arranged in the execution order.

The diaphragm 60 bends toward the space S (toward vibrator 50) as shown in FIG. 3 when the space S is in a vacuum and airtightness with respect to the outside, which is the atmosphere, is maintained. In other words, the diaphragm 60 dents toward the interior of the vibration device 100. When the space S is not airtight, that is, there is leakage between the interior of the space S and the outside, the diaphragm 60 is flat (is not deformed) because there will be no difference in pressure between the space S and the outside.

The semiconductor substrate 40 including the integrated circuit 41 is disposed on the side facing at least one of the first surface 10a and the second surface 10b of the base 10, as described above. The lid 20 (specifically, portion of lid 20 except for portion having opening) is disposed so as to overlap with at least part of the integrated circuit 41, as shown in FIG. 2. In other words, the lid 20 is disposed so as to overlap with at least part of the semiconductor substrate 40 including the integrated circuit 41. The integrated circuit 41 is a circuit including active elements, such as transistors.

Since the lid 20 is disposed so as to overlap with the semiconductor substrate 40 including the integrated circuit 41 as described above, the size of the vibration device 100 can be reduced as compared with a case where the lid 20 is disposed so as not to overlap with the integrated circuit 41.

The external terminals 30 are formed at the second surface 10b of the base 10. The external terminal 30 is electrically coupled to the integrated circuit 41 in the semiconductor substrate 40 via a through electrode 31 provided through the base 10. An insulating layer 32 is formed between the external terminals 30 and the base 10. The insulating layer 32 is also formed between the through electrode 31 and the base 10.

A method for manufacturing the vibration device 100 will next be described with reference to FIGS. 4 to 11. The method for manufacturing the vibration device 100 primarily includes forming the base 10, forming the vibrator 50, forming the lid 20, and bonding and inspection.

A method for manufacturing the base 10 will first be described. In step S11, a silicon wafer is prepared, and a through hole for forming the through electrode 31 is formed in a portion, of the silicon wafer, which forms the base 10. Specifically, dry etching is performed on the base 10 to form the through hole. A thermal oxide film is then formed at the inner wall of the through hole and the second surface 10b of the base 10 to complete the through hole with the insulating layer 32 formed therein.

In step S12, the through electrode 31 and the external terminals 30 are formed. Specifically, for example, the through electrode 31 and the external terminals 30 are formed by burying polysilicon in the through hole and patterning polysilicon at the second surface 10b of the base 10. The through electrodes 31 may be formed after the semiconductor substrate 40 is formed. It is, however, noted that forming the through electrode 31 first reduces the number of defects in the semiconductor substrate 40, which is a multilayered substrate, and therefore allows formation of a high-quality base 10.

In step S13, the semiconductor substrate 40 including the integrated circuit 41 is formed. In step S14, the mount electrode 52 is formed on the semiconductor substrate 40. In step S15, bumps 70 are formed. Specifically, a known manufacturing method is used to form an electrode that is not illustrated but is electrically coupled to the integrated circuit 41 and form the mount electrode 52 and the electrically conductive bonding member 51 on the electrode. On the other hand, the bumps 70 to be coupled to the external terminals 30 are formed at the second surface 10b of the base 10.

Figure 8:
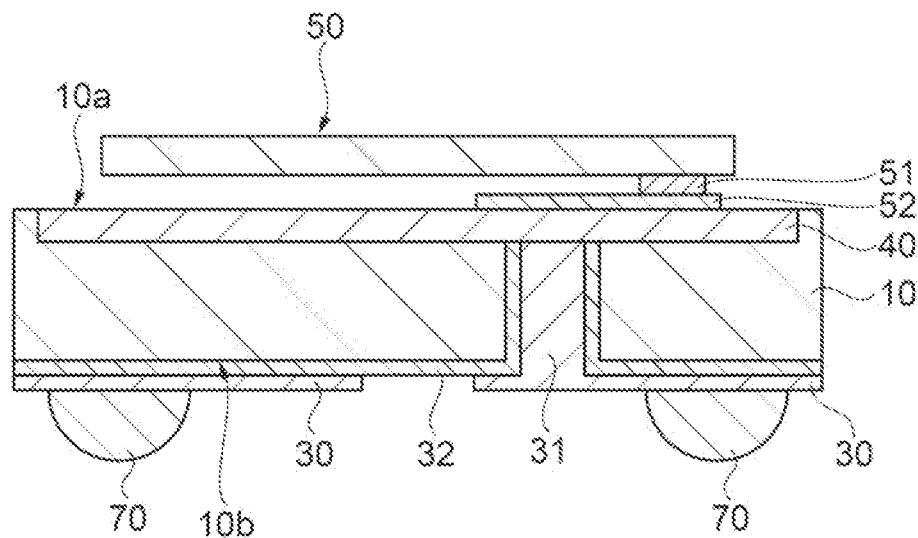
FIG. 8 is a cross-sectional view showing the method for manufacturing the vibration device.

Thereafter, in step S21, the vibrator 50 is formed by using a known manufacturing method. In step S22, the vibrator 50 is mounted on the base 10, as shown in FIG. 8. Specifically, terminals of the vibrator 50, which are not illustrated, are electrically coupled to the mount electrode 52 via the electrically conductive bonding member 51. The vibrator 50 is thus mounted on the first surface 10a of the base 10.

Figure 5:
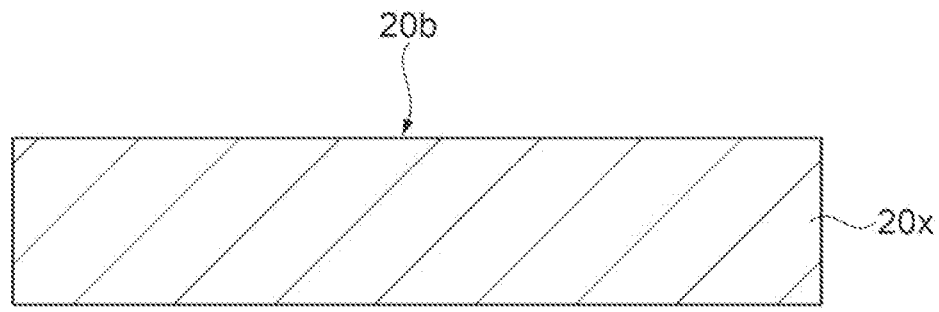
FIG. 5 is a cross-sectional view showing the method for manufacturing the vibration device.
Figure 6:
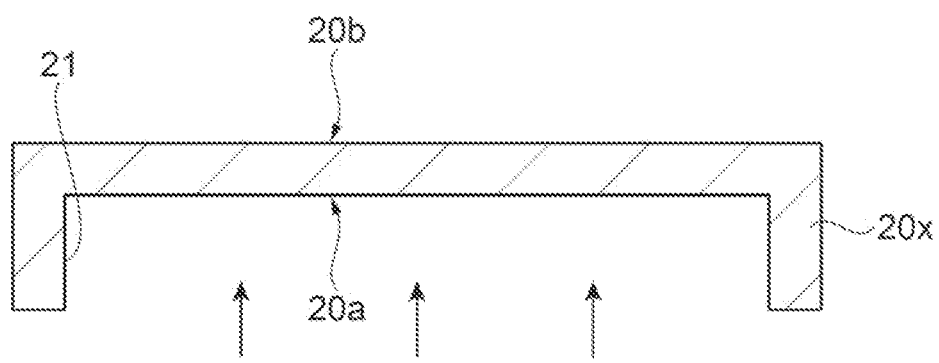
FIG. 6 is a cross-sectional view showing the method for manufacturing the vibration device.
Figure 7:
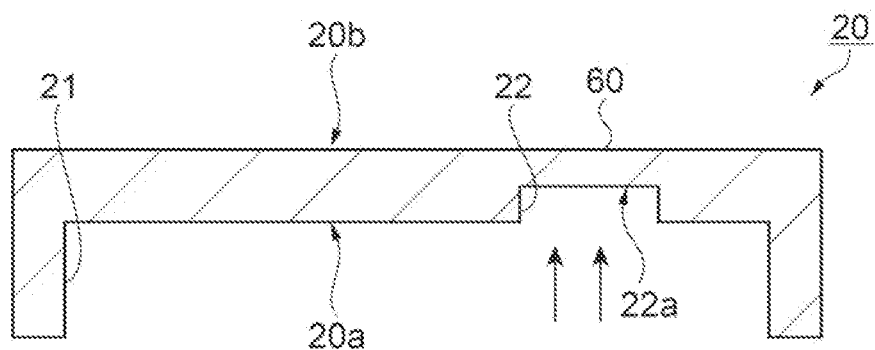
FIG. 7 is a cross-sectional view showing the method for manufacturing the vibration device.

A method for manufacturing the lid 20 will next be described. It is noted that FIGS. 5 to 7 are aligned with the orientation of the disposed vibration device 100 shown in FIG. 2. In step S31, a silicon wafer 20x, which forms the lid 20, is prepared and cleaned, as shown in FIG. 5.

In step S32, the first recess 21 is formed in the silicon wafer 20x. Specifically, the first recess 21, the bottom of which is the third surface 20a, is formed by using known photolithography and etching technologies, as shown in FIG. 6.

In step S33, the second recess 22 is formed in part of the bottom of the first recess 21. Specifically, the second recess 22, which has the bottom surface 22a, is formed by using known photolithography and etching technologies, as shown in FIG. 7, as the first recess 21 is formed. The bottom surface 22a and the fourth surface 20b are portions that later function as the diaphragm 60.

The bonding and inspection will next be described. In step S41, the base 10 and the lid 20 are so positioned that the base 10 and the lid 20 are bonded to each other. A metal layer for the bonding is formed in advance at a portion, of the base 10, corresponding to a bonding section 11 (see FIG. 9), and a metal layer for the bonding is formed at a portion, of the lid 20, corresponding to the bonding section 11.

In step S42, the surfaces of the metal layers of the base 10 and the lid 20 are activated. In step S43, the base 10 and the lid 20 are bonded to each other based on activated bonding.

Figure 9:
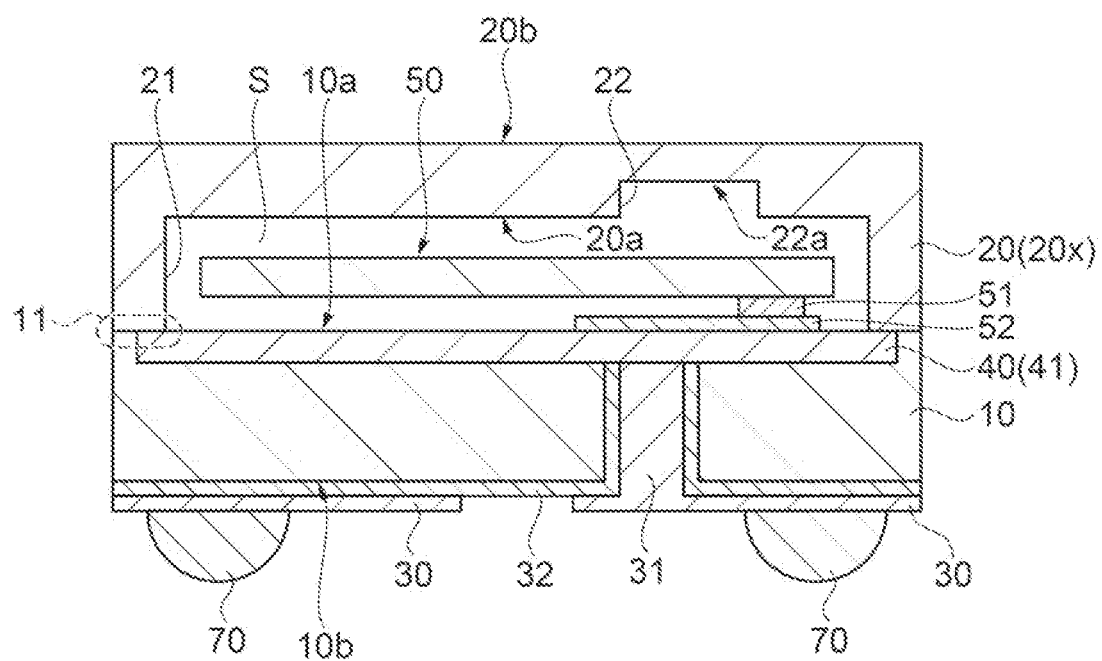
FIG. 9 is a cross-sectional view showing the method for manufacturing the vibration device.

Specifically, the surfaces of the metal layers are activated by irradiating the metal layers, for example, with a neutral argon ion beam. The lid 20 is then placed on the base 10 and the metal layers are brought into contact with each other, as shown in FIG. 9. That is, the silicon wafer that forms the base 10 and the silicon wafer 20x that forms the lid 20 are attached to each other.

The activated bonding bonds the metal layers to each other into the bonding section 11. The silicon wafer that forms the base 10 and the silicon wafer 20x that forms the lid 20 are thus attached to each other into a silicon wafer in which a plurality of vibration devices 100 are collectively formed.

Figure 10:
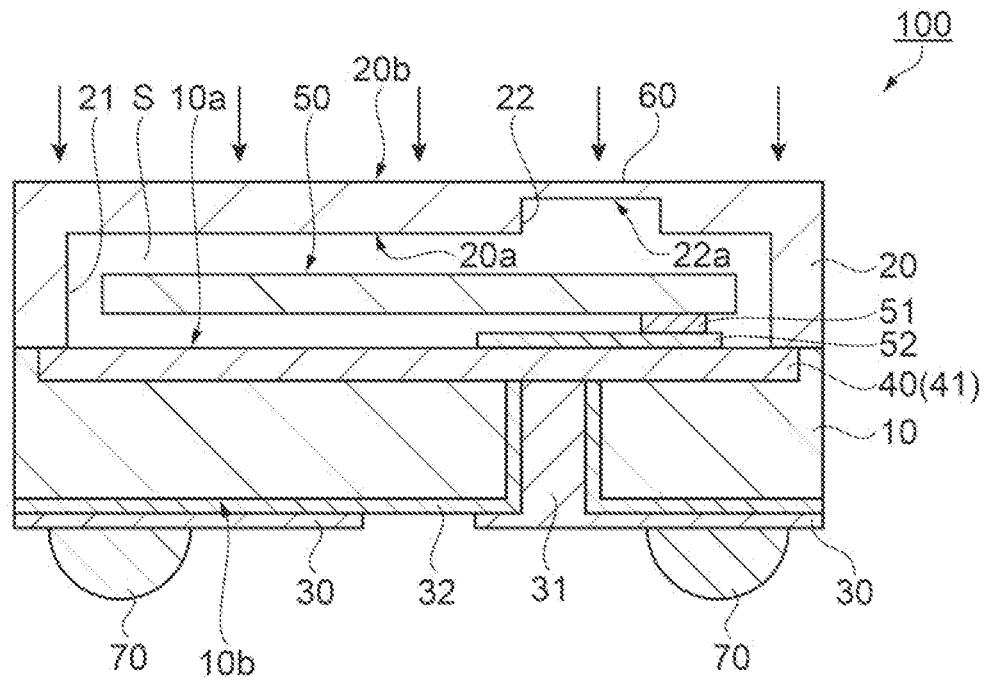
FIG. 10 is a cross-sectional view showing the method for manufacturing the vibration device.

In step S44, the silicon wafer may be polished or ground into a thin plate to reduce the thickness of the vibration devices 100, as shown in FIG. 10. The fourth surface 20b of the lid 20 is thus polished, whereby a diaphragm 60 formed of the bottom surface 22a of the second recess 22 and the fourth surface 20b and having a predetermined thickness is completed.

Figure 11:
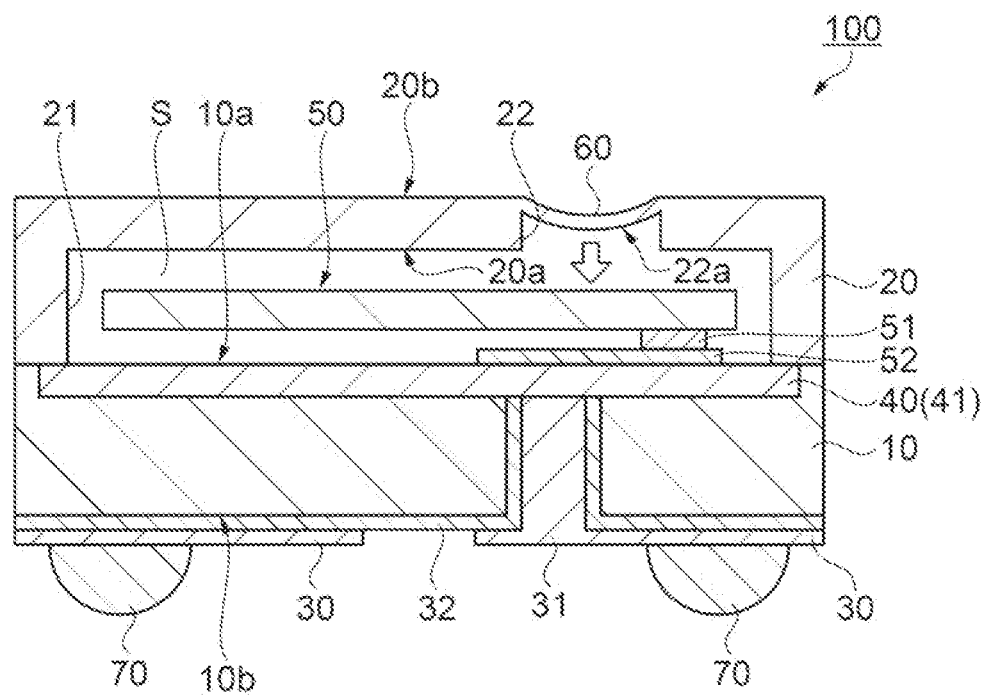
FIG. 11 is a cross-sectional view showing the method for manufacturing the vibration device.

In step S45, the state of the bonding of the vibration device 100 is inspected. Specifically, an airtightness inspection (in other words, leakage inspection) is performed based on the amount of deformation of the diaphragm 60 provided at the lid 20, as shown in FIG. 11. The amount of deformation of the diaphragm 60 may be measured, for example, with a microscope, a three-dimensional measurement instrument, or a laser displacement meter. The amount of deformation may instead be visually examined.

The pressure in the space S sealed by the base 10 and the lid 20 is vacuum pressure. The pressure in the space around the vibration device 100 is atmospheric pressure. The difference in pressure therefore causes the diaphragm 60 to dent toward the space S. When the space S is airtightly sealed by the bonding, in other words, when there is no leakage, the diaphragm 60 deforms as described above. When the space S is not airtightly sealed, in other words, when there is leakage, the diaphragm 60 does not deform but is flat because the space around the vibration device 100 and the space S are both under the atmospheric pressure.

For example, consider a case where the diaphragm 60 has a diameter of 200 μm and a thickness of about 10 μm. When the pressure in the space S is vacuum pressure, the diaphragm 60 dents by about 15 nm. The leakage inspection can thus be performed by measuring the amount of deformation of the diaphragm 60.

In step S46, the vibration devices 1 are separated from the silicon wafer or individualized by using dicing or any other cutting method. The vibration devices 100 can be manufactured by carrying out the manufacturing steps described above.

As described above, the vibration device 100 according to the present embodiment includes the base 10 having the first surface 10a and the second surface 10b, which is a rear surface with respect to a front surface that is the first surface 10a, the vibrator 50 disposed at the first surface 10a, and the lid 20, which has the first recess 21, which opens toward the first surface 10a, the third surface 20a, which is the bottom surface of the first recess 21, and the fourth surface 20b, which is a rear surface with respect to a front surface that is the third surface 20a, the lid 20 being so bonded to the first surface 10a that the vibrator 50 is encapsulated in the first recess 21, and the lid 20 has the second recess 22, which is part of the third surface 20a recessed toward the fourth surface 20b, and includes the diaphragm 60 formed of the bottom surface 22a of second recess 22 and the fourth surface 20b.

According to the configuration described above, since the lid 20 includes the diaphragm 60, the airtightness (that is, leakage) of the space S, as the sealed section where the lid 20 is bonded to the base 10 on which the vibrator 50 is mounted, can be inspected based on the displacement of the diaphragm 60. The number of required man-hours can therefore be reduced as compared with a leakage inspection method based on multiple inspections, whereby the manufacturing cost can be suppressed. Furthermore, the leakage inspection can be readily performed. In addition, the outer surface (that is, fourth surface 20b) of the lid 20 (that is, surface of lid 20 opposite from surface at which vibrator 50 is disposed) is smooth with no step, so that the lid 20 is unlikely to be damaged. Furthermore, the displacement of the diaphragm 60 can be inspected by using the outer surface of the lid 20 as a reference, so that the inspection can be readily performed.

It is preferable that the diaphragm 60 has a circular shape in the plan view in the direction perpendicular to the first surface 10a. According to the configuration described above, since the diaphragm 60 has a circular shape and concentrically bends due to a change in the internal pressure in the space S, a change in the shape of the diaphragm 60 is checked and further measured readily.

It is preferable that the base 10 and the lid 20 are each a single-crystal silicon substrate. According to the configuration described above, since the base 10 and the lid 20 are each formed of a substrate made of the same single-crystal silicon, thermal stress due to a change in temperature is unlikely to be induced, whereby deformation of the diaphragm 60 due to a change in temperature can be suppressed. The deformation of the diaphragm 60 due to a change in the internal pressure in the space S as the sealed section can therefore be accurately inspected.

It is preferable that the semiconductor substrate 40 including the integrated circuit 41 is disposed at least at one of the first surface 10a and the second surface 10b of the base 10. According to the configuration described above, since the semiconductor substrate 40 is disposed at the first surface 10a and/or the second surface 10b of the base 10, the size of the vibration device 100 can be reduced as compared with a case where the semiconductor substrate 40 is configured as a component separate from the base 10.

It is preferable that the semiconductor substrate 40 is disposed on the side facing the first surface 10a, that the external terminals 30 are disposed at the second surface 10b, and that an external terminal 30 is electrically coupled to the integrated circuit 41 via the through electrode 31 disposed in the base 10. According to the configuration described above, since the external terminal 30 electrically coupled to the integrated circuit 41 is disposed at the second surface 10b, the electrical characteristics of the integrated circuit 41 can be checked, for example, by using the external terminal 30 in the state in which the vibration device is still in the form of a silicon wafer.

The method for manufacturing the vibration device 100 according to the present embodiment includes preparing the base 10, mounting the vibrator 50 on the base 10, preparing the lid 20, forming the first recess 21 in the lid 20, forming the second recess 22 further recessed from the first recess 21, bonding the lid 20 to the base 10 in such a way that the vibrator 50 is accommodated in the first recess 21 and encapsulated by the lid 20 and the base 10, and processing the surface, of the lid 20, opposite from the second recess 22 to produce a thin-plate structure.

According to the method described above, since the first recess 21 and the second recess 22 are formed on the same side of the lid 20, the recesses can be continuously formed, whereby the diaphragm 60 can be relatively readily formed. Furthermore, since part of the interior of the lid 20 forms the first recess 21 and the second recess 22, fracture of the lid 20 can be suppressed in the step of producing the thin-plate structure as compared with a case where the recesses are formed on the outer side of the lid 20. Moreover, since the second recess 22 is not formed on the outer side of the lid 20 (that is, side of lid 20 opposite from side where vibrator 50 is disposed), the second recess 22 can be formed without a large amount of etching. That is, etched depth variation caused by the large amount of etching can be suppressed, whereby variation in thickness of the diaphragm 60 can be suppressed.

It is preferable that the method further includes inspecting the state of the airtightness of the space S as the sealed section where the vibrator 50 is encapsulated, and that the inspecting includes measuring the displacement of the diaphragm 60, which is formed of the bottom surface 22a of the second recess 22 and the surface, of the lid 20, opposite from the second recess 22 (that is, fourth surface 20b). According to the method described above, since the second recess 22 is formed on the inner side of the lid 20 (that is, side facing vibrator 50), a flat outer surface of the lid 20 (that is, fourth surface 20b) can be provided. The amount of deformation of the diaphragm 60 can therefore be inspected with respect to the flat surface.

The configuration of the vibration device 100 according to a second embodiment and a method for manufacturing the vibration device 100 will next be described with reference to FIGS. 12 to 15.

Figure 12:
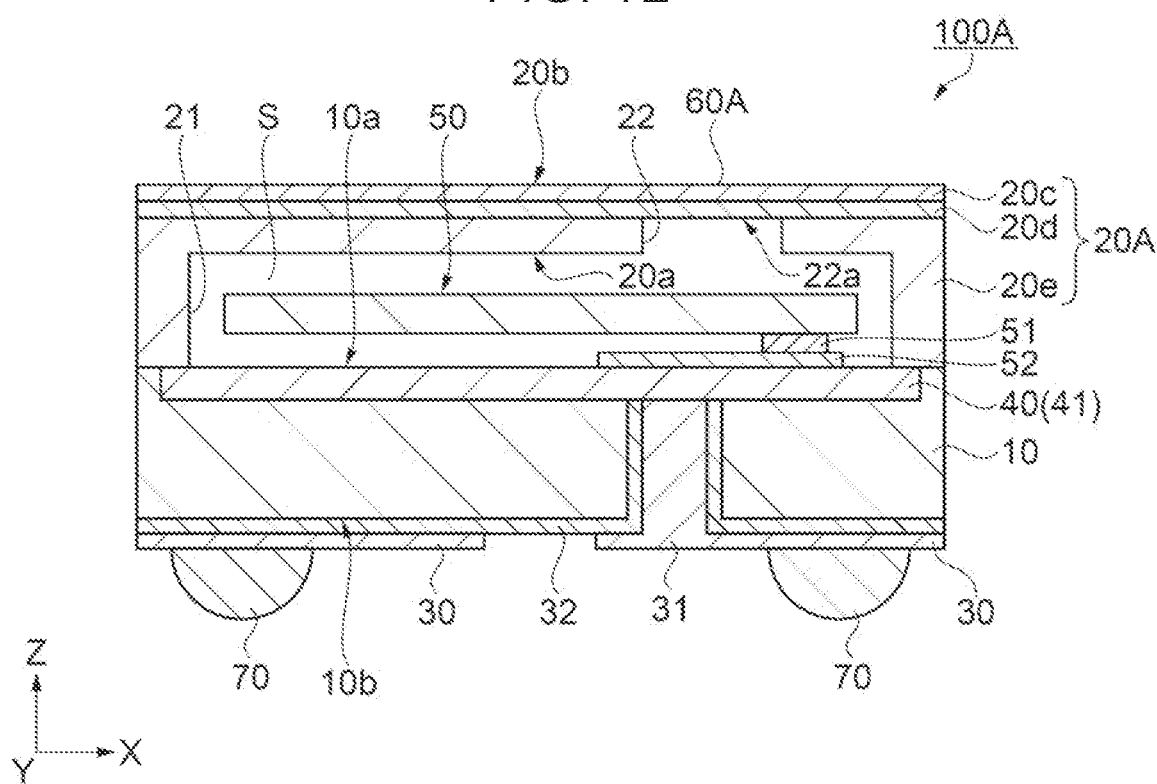
FIG. 12 is a cross-sectional view showing the configuration of a vibration device according to a second embodiment.

A vibration device 100A according to the second embodiment differs from the vibration device 100 according to the first embodiment in that a diaphragm 60A is configured by using an SOI substrate (silicon on insulator) 20A1 as a lid 20A, as shown in FIG. 12. The other configurations are substantially the same as those in the first embodiment. Therefore, in the second embodiment, portions different from those in the first embodiment will be described in detail, and other duplicate portions will not be described as appropriate.

In the vibration device 100A according to the second embodiment, the SOI substrate 20A1 is used as the lid 20A, as described above. The SOI substrate 20A1 is, for example, a substrate in which a SiO$_2$ (silicon oxide) layer is disposed on a Si (silicon) substrate with a Si (silicon) layer further disposed on the SiO$_2$ layer.

The lid 20A in the second embodiment includes a silicon substrate 20c, a silicon oxide layer 20d, and a silicon layer 20e sequentially disposed from the side facing the fourth surface 20b, as shown in FIG. 12. The first recess 21 and the second recess 22, which forms the diaphragm 60A, are formed in the silicon layer 20e. The bottom surface 22a of the second recess 22 exposes the surface of the silicon oxide layer 20d. The bottom surface 22a of the second recess 22 and the fourth surface 20b form the diaphragm 60A in the second embodiment.

A method for manufacturing the vibration device 100A according to the second embodiment will next be described.

Only a method for manufacturing the lid 20A, in terms of which the second embodiment differs from the first embodiment, will be described.

Figure 13:
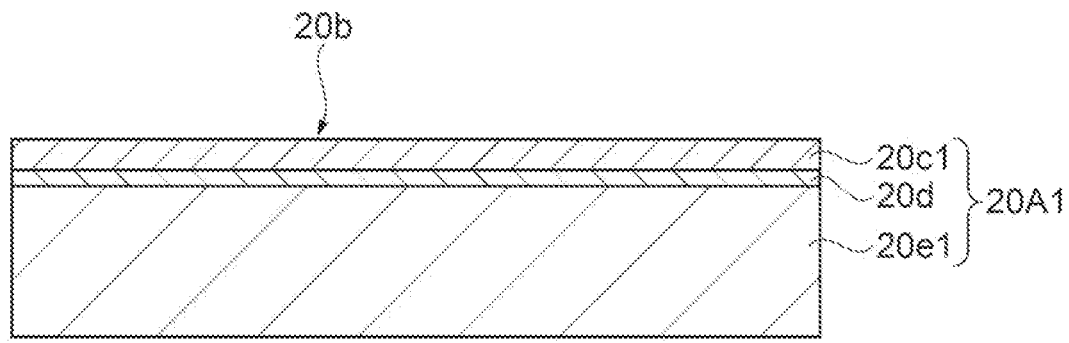
FIG. 13 is a cross-sectional view showing a method for manufacturing the vibration device.

The SOI substrate 20A1 is first prepared, as shown in FIG. 13. The SOI substrate 20A1 is formed of a silicon substrate 20c1, the silicon oxide layer 20d, and a silicon layer 20e1 stacked in this order from the side facing the fourth surface 20b.

Figure 14:
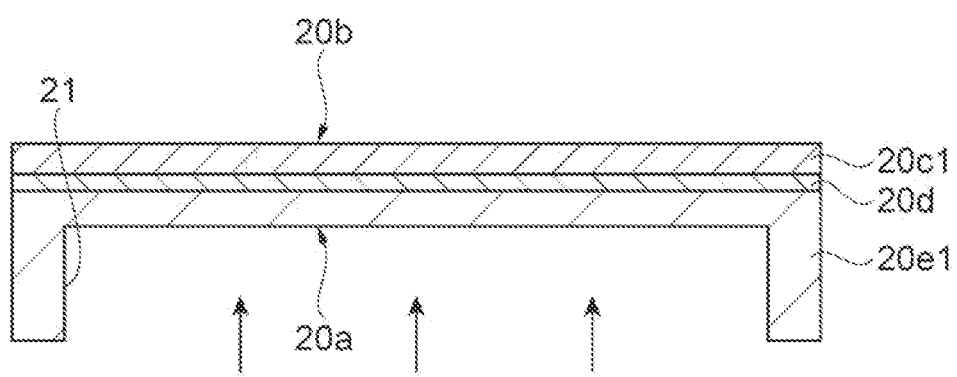
FIG. 14 is a cross-sectional view showing the method for manufacturing the vibration device.

The first recess 21, the bottom of which is the third surface 20a, is then formed in the silicon layer 20e1 by using known photolithography and etching technologies, as shown in FIG. 14. The size of the first recess 21 is the same as that in the first embodiment.

Figure 15:
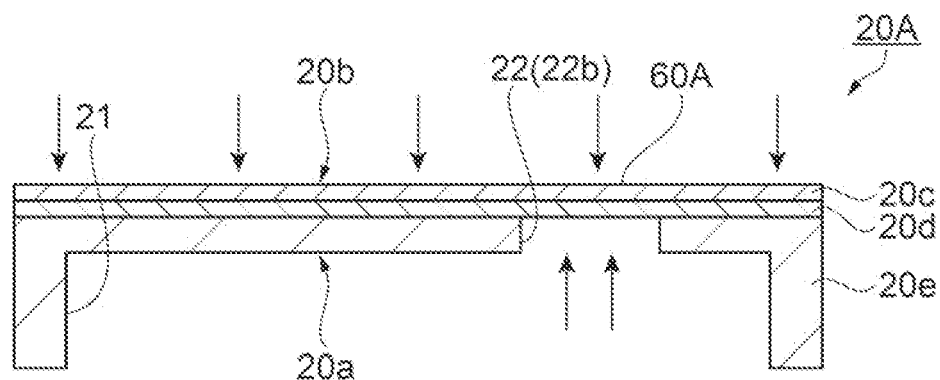
FIG. 15 is a cross-sectional view showing the method for manufacturing the vibration device.

The second recess 22 is then formed in part of the bottom of the first recess 21, as shown in FIG. 15. Specifically, a through hole 22b, which passes through the silicon layer 20e1, is formed in part of the third surface 20a by using known photolithography and etching technologies. It is noted that the through hole 22b is formed by using the silicon oxide layer 20d as an etching stopper layer. The second recess 22 is thus formed with the surface of the silicon oxide layer 20d exposed to the interior of the through hole 22b. The portion formed of the bottom surface 22a, which exposes the surface of the silicon oxide layer 20d, and the fourth surface 20b later functions as the diaphragm 60A.

The silicon oxide layer 20d can thus be used as the etching stopper layer to provide a high-precision thickness of the diaphragm 60A formed of the silicon oxide layer 20d and the silicon substrate 20c. Furthermore, variation in thickness of the diaphragm 60A among the chips can be suppressed, whereby variation in the amount of deformation of the diaphragm 60A among the chips can also be suppressed. As a result, the accuracy of the leakage inspection can be improved.

The fourth surface 20b of the silicon substrate 20c1 is then processed to produce a thin-plate structure. The diaphragm 60A is thus completed. The lid 20A in the second embodiment is also completed.

As described above, in the vibration device 100A according to the second embodiment and the method for manufacturing the vibration device 100A, the lid 20A is the SOI substrate 20A1 including the silicon oxide layer 20d, and the third surface 20a of the diaphragm 60A exposes the silicon oxide layer 20d.

According to the configuration described above, which uses the SOI substrate 20A1, the diaphragm 60A can be formed by etching using the silicon oxide layer 20d as the etching stopper layer, whereby a high-thickness-precision diaphragm 60A can be relatively readily formed. As a result, a highly accurate leakage inspection can be performed even on a small chip.

Variations of the embodiments described above will be described below.

As described above, each of the diaphragms 60 and 60A does not necessarily have a circular shape and may have a quadrangular shape or any other shape.

In the inspection of leakage of the diaphragms 60 and 60A, the vibration device 100 or 100A may be left in a container containing pressurized helium (He) for a long period and then taken out from the container into the atmosphere under the atmospheric pressure, and the amount of deformation of the diaphragm 60 or 60A may be measured. When there is a leakage in the vibration device 100 or 100A, the pressurized helium pressurizes the interior of the vibration device 100 or 100A. Since the diaphragm 60 or 60A deforms into a convex shape when the vibration device 100 or 100A is taken out from the container into the atmosphere under the atmospheric pressure, the leakage can be readily checked by measuring the amount of deformation.

The leakage inspection is not necessarily performed in the bonding inspection in step S45 and may be performed, for example, after step S46, in which the individualization is performed.

In the formation of the lid 20, the first recess 21 is formed, and then the second recess 22 is formed, but not necessarily. The first recess 21 may be formed after the second recess 22 is formed.

The vibration devices 100 and 100A described above can each be suitably used as an oscillator and an inertia sensor, such as an acceleration sensor and an angular velocity sensor.

What is claimed is:

1. A vibration device comprising:
   a base having a first surface and a second surface that is in a front-back relationship with the first surface;
   a vibrator disposed at the first surface; and
   a lid having a first recess that opens toward the first surface, a third surface that is a bottom surface of the first recess, and a fourth surface that is in a front-back relationship with the third surface, the lid being so bonded to the first surface that the vibrator is encapsulated in the first recess,
   wherein the lid has a second recess that is part of the third surface recessed toward the fourth surface and includes a diaphragm formed of a bottom surface of the second recess and the fourth surface, and
   the diaphragm is configured to displace due to changes in an internal pressure in a space in which the vibrator is sealed.

2. The vibration device according to claim 1,
   wherein the diaphragm has a circular shape in a plan view in a direction perpendicular to the first surface.

3. The vibration device according to claim 1,
   wherein the base and the lid are each a single-crystal silicon substrate.

4. The vibration device according to claim 1,
   wherein the lid is an SOI substrate including a $SiO_2$ layer, and
   the third surface of the diaphragm exposes the $SiO_2$ layer.

5. The vibration device according to claim 1,
   wherein a semiconductor substrate including an integrated circuit is disposed at least at one of the first surface and the second surface of the base.

6. The vibration device according to claim 5,
   wherein the semiconductor substrate is disposed on a side facing the first surface,
   an external terminal is disposed at the second surface, and
   the external terminal is electrically coupled to the integrated circuit via a through electrode disposed in the base.

7. A method for manufacturing a vibration device, the method comprising:
   preparing a base;
   mounting a vibrator on the base;
   preparing a lid;
   forming a first recess in the lid;
   forming a second recess further recessed from the first recess;
   bonding the lid to the base in such a way that the vibrator is accommodated in the first recess and encapsulated by the lid and the base;
   processing a surface, of the lid, opposite from the second recess to produce a thin-plate structure; and
   inspecting a state of airtightness of a sealed section where the vibrator is encapsulated,
   wherein the inspecting includes, measuring displacement of a diaphragm formed of a bottom surface of the second recess and a surface, of the lid, opposite from the second recess.

* * * * *